(12) United States Patent
Chen et al.

(10) Patent No.: US 10,770,780 B2
(45) Date of Patent: Sep. 8, 2020

(54) ANTENNA APPARATUS AND CIRCUIT BOARD THEREOF

(71) Applicant: Microelectronics Technology, Inc., Hsinchu (TW)

(72) Inventors: Chang-Chun Chen, Hsinchu (TW); Wei Huang Chen, Zhubei (TW); Tung-Hua Yang, Hsinchu (TW)

(73) Assignee: MICROELECTRONICS TECHNOLOGY, INC., Hsinchu (TW)

( * ) Notice: Subject to any disclaimer, the term of this patent is extended or adjusted under 35 U.S.C. 154(b) by 313 days.

(21) Appl. No.: 16/002,922

(22) Filed: Jun. 7, 2018

(65) Prior Publication Data

US 2019/0051970 A1    Feb. 14, 2019

Related U.S. Application Data

(60) Provisional application No. 62/543,611, filed on Aug. 10, 2017.

(51) Int. Cl.

| H01Q 1/22 | (2006.01) |
|---|---|
| H05K 5/04 | (2006.01) |
| H01Q 1/38 | (2006.01) |
| H05K 1/02 | (2006.01) |
| H01Q 21/08 | (2006.01) |
| H01Q 19/00 | (2006.01) |
| H01Q 9/04 | (2006.01) |

(52) U.S. Cl.
CPC ......... *H01Q 1/2208* (2013.01); *H01Q 1/2216* (2013.01); *H01Q 1/38* (2013.01); *H01Q 9/0428* (2013.01); *H01Q 19/005* (2013.01); *H01Q 21/08* (2013.01); *H05K 1/0242* (2013.01); *H05K 5/04* (2013.01); *H05K 2201/09236* (2013.01); *H05K 2201/10098* (2013.01)

(58) Field of Classification Search
CPC .. H01Q 1/22; H01Q 1/38; H01Q 9/04; H01Q 19/00; H01Q 21/08; H05K 1/02; H05K 5/04
USPC .................................................... 343/700 MS
See application file for complete search history.

(56) References Cited

U.S. PATENT DOCUMENTS

| 2015/0357717 A1* | 12/2015 | Petted ...................... H01Q 1/38 343/700 MS |
| 2015/0380808 A1* | 12/2015 | Sugimura ................ H01Q 1/38 343/700 MS |
| 2016/0043470 A1* | 2/2016 | Ko .......................... H01Q 21/24 343/843 |

* cited by examiner

*Primary Examiner* — Andrea Lindgren Baltzell
(74) *Attorney, Agent, or Firm* — Muncy, Geissler, Olds & Lowe, P.C.

(57) ABSTRACT

The present disclosure provides an antenna apparatus and a circuit board thereof for an RFD device to provide wide field effect coverage. The antenna apparatus includes a housing having a concavity defined therein, a printed circuit board disposed inside the concavity of the housing, two plates respectively located on opposite side portions of the circuit board, and a metal pattern sandwiched between and wirelessly coupled to the two plates. By disposing the metal pattern at the central portion of the circuit board and sandwiched between and coupled to the two plates, the field effect is enhanced, and the sensitivity of the antenna apparatus when detecting an object passing through the field (near field detection) is improved.

20 Claims, 6 Drawing Sheets

ANTENNA APPARATUS AND CIRCUIT BOARD THEREOF

PRIORITY CLAIM AND CROSS-REFERENCE

This application claims priority of U.S. provisional application Ser. No. 62/543,611 filed on Aug. 10, 2017, which is incorporated by reference in its entirety.

TECHNICAL FIELD

The present disclosure relates to an antenna apparatus and a circuit board thereof, and more particularly, to an antenna apparatus and a circuit board for an RFID (Radio Frequency Identification) reader in association with an electronic tag to precisely identify and count objects passing through the antenna's region.

DISCUSSION OF THE BACKGROUND

An RFID system uses tags (or labels) attached to the objects to be identified. Two-way radio transmitter-receivers, called interrogators or readers, send a signal to the tag and read its response.

RFID tags can be passive, active or battery-assisted passive. An active RFID tag has an on-board battery and periodically transmits its ID signal. A battery-assisted passive (BAP) RFID tag has a small battery on board and is activated when in the presence of an RFID reader. A passive RFID tag is cheaper and smaller because it has no battery; instead, the tag uses the radio energy transmitted by the reader. However, to operate a passive tag, the passive tag must receive a radio transmission with a power level roughly one thousand times stronger than that required for signal transmission. Such transmission requirement creates significant comparative differences in terms of interference and exposure to radiation.

Tags may be read-only, having a factory-assigned serial number that serves as a key to a database, or may be read/write, where object-specific data can be written into the tag by the system user. Field programmable tags may be write-once/read-multiple; "blank" tags may be written with an electronic product code by the user.

RFID tags contain at least three parts: an integrated circuit for storing and processing information that modulates and demodulates radio-frequency (RF) signals; a means of collecting DC power from the incident reader signal; and an antenna for receiving and transmitting the signal. The tag information is stored in a non-volatile memory. The RFID tag includes fixed or programmable logic for processing the transmission and sensor data.

Normally, the RFID sensing system has an antenna provided to generate a field effect. With the field effect, whenever an object passes through the field and creates a disturbance in the field, a microelectric charge is induced to indicate that an object passes through the field. If the field coverage is wide enough, then the detection result might be sufficient to provide an accurate result to the hosting party. However, current commercially available sensing systems do not fulfill the requirements to do so.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

The present disclosure provides an antenna apparatus and a circuit board thereof for an RFID device to provide wide field effect coverage.

In some embodiments of the present disclosure, the antenna apparatus comprises a metal housing having a concavity defined therein; a printed circuit board disposed inside the concavity of the housing; two plates respectively located on two opposite side portions of the circuit board; and a metal pattern sandwiched between and wirelessly coupled to the two plates.

In some embodiments of the present disclosure, the circuit board comprises a substrate, two plates respectively located on two opposite side portions of the substrate, and a metal pattern sandwiched between and wirelessly coupled to the two plates.

In some embodiments of the present disclosure, the antenna apparatus further comprises a cover having a periphery securely engaged with a periphery of the housing.

In some embodiments of the present disclosure, the two plates are identically and symmetrically positioned with respect to a central portion of the circuit board.

In some embodiments of the present disclosure, each of the two plates is substantially square in shape and has at least one truncated corner.

In some embodiments of the present disclosure, each of the two plates has two truncated corners diagonally opposite to one another.

In some embodiments of the present disclosure, the metal pattern comprises a single wandering line with two distal ends each pointing toward a respective one of the two plates.

In some embodiments of the present disclosure, the single wandering line comprises an odd number of turns on one side and an even number of turns on the other side.

In some embodiments of the present disclosure, the metal pattern comprises a plurality of parallel metal lines.

In some embodiments of the present disclosure, the parallel metal line includes two distal ends respectively pointing toward a respective one of the two plates.

In some embodiments of the present disclosure, the metal pattern comprises an odd number of parallel metal lines.

In some embodiments of the present disclosure, the metal pattern comprises a first metal line and two second metal lines disposed at two sides of the first metal line.

In some embodiments of the present disclosure, the first metal line includes a first turn on one side and two second turns on the other side, and the first turn occupies a larger area than the second turn.

In some embodiments of the present disclosure, the first metal line includes two distal ends in the first turn.

In some embodiments of the present disclosure, the second metal line comprises an odd number of turns on one side and two distal ends on the other side.

In some embodiments of the present disclosure, the antenna apparatus further comprises a metal wire connecting the two plates, wherein the metal wire comprises at least one protrusion.

In some embodiments of the present disclosure, the metal wire is electrically isolated from the metal pattern.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
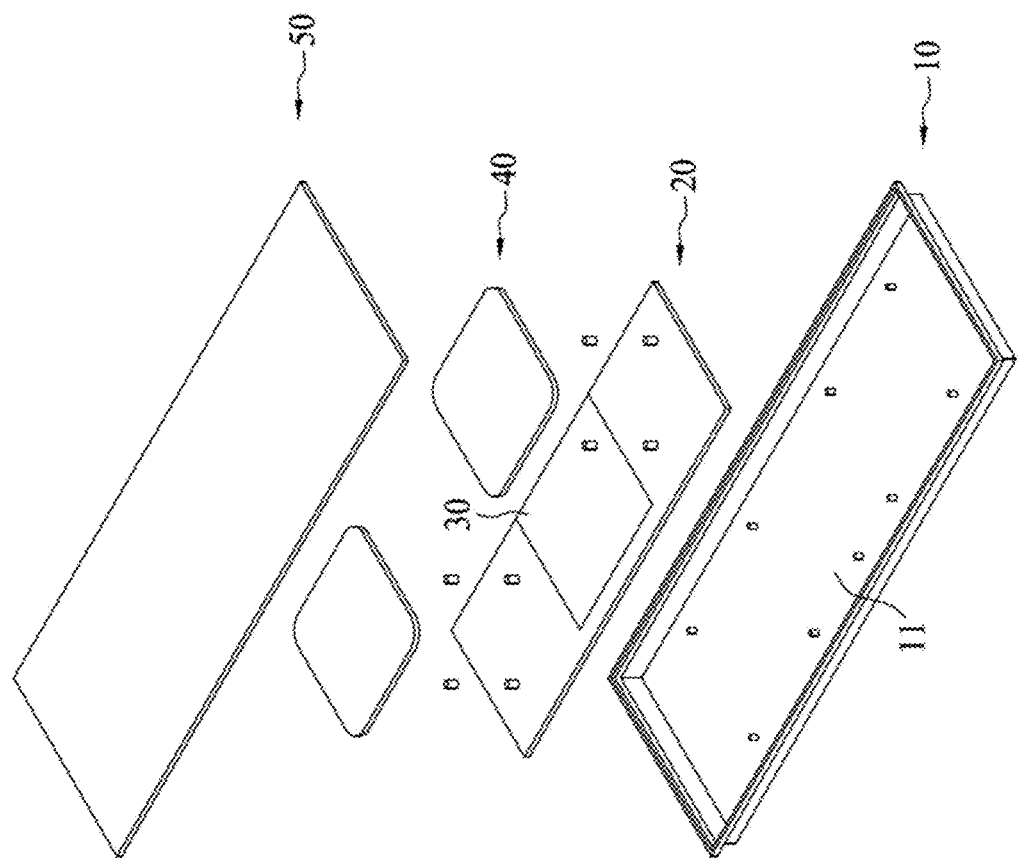
FIG. 1 is an exploded perspective view of an antenna apparatus in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

An RFID reader transmits an encoded radio signal to interrogate the tag. The RFID tag receives the message and then responds with its identification and other information. This may be only a unique tag serial number or may be product-related information such as a stock number, lot or batch number, production date, or other specific information. Since tags have individual serial numbers, the RFID system can differentiate among several tags that might be within the range of the RFID reader and read them simultaneously.

RFID systems can be classified by the type of tag and reader. A Passive Reader Active Tag (PRAT) system has a passive reader which receives radio signals only from active tags (battery operated, transmit only). The reception range of a PRAT system reader can be adjusted from 0 to 2,000 feet (0 to 600 m), allowing flexibility in applications such as asset protection and supervision.

An Active Reader Passive Tag (ARPT) system has an active reader, which transmits interrogator signals and also receives authentication replies from passive tags.

An Active Reader Active Tag (ARAT) system uses active tags that are awoken with an interrogator signal from the active reader. A variation of this system could also use a Battery-Assisted Passive (BAP) tag, which acts like a passive tag but has a small battery to power the tag's return reporting signal.

Fixed readers are set up to create a specific interrogation zone, which can be tightly controlled. This allows a highly defined reading area for when tags enter and exit the interrogation zone. Mobile readers may be hand-held or mounted on carts or vehicles.

RFID tags are often a complement to, but not a substitute for, UPC (Universal Product Code) or EAN barcodes. They may never completely replace barcodes, due in part to their higher cost and the advantage of multiple data sources on the same object. Also, unlike RFID labels, barcodes can be generated and distributed electronically, e.g. via e-mail or mobile phone, for printing or display by the recipient. An example is airline boarding passes. The new EPC, along with several other schemes, is widely available at reasonable cost.

The storage of data associated with tracking items will require many terabytes. Filtering and categorization of RFID data is needed to create useful information. It is likely that goods will be tracked at the pallet level using RFID tags, and at the package level using unique UPC or EAN barcodes.

The unique identifier is a mandatory requirement for RFID tags, regardless of the numbering scheme. RFID tag data capacity is large enough to permit each individual tag to have a unique code, while current bar codes are limited to a single type of code for a particular product. The uniqueness of RFID tags means that a product may be tracked as it moves from location to location until finally reaching the consumer. This may help to reduce theft and other forms of product loss. The tracking of products is well supported with RFID tags containing a unique identifier of the tag and also the serial number of the object. This may help companies cope with quality deficiencies and resulting recall campaigns, but also raises concerns about tracking and profiling of consumer behaviors after the sale.

From the above discussion, it can be understood that the RFID technology can be implemented in a variety of different applications including, but not limited to, wholesale markets, retail markets (using near field systems) and even highways (using far field systems) to quickly identify objects passing through the electromagnetic field.

In addition, from the above discussion, it can also be appreciated that time-efficient identification of objects is a key issue for current technology. There is an urgent need for a method to accurately monitor and quickly identify fast-moving objects passing through a field over an extended period of time.

For example, the traditional method of timing and identifying racing pigeons involves bands with unique identification numbers and a specially designed object timer. The band is attached around the bird's leg. The serial number is recorded, the timer is set and sealed, and the bird carries the band home. When the first bird returns, its owner removes the band and places it in a slot in the timer. The time at which the band is placed in the timer is recorded as the official time at which the competing bird arrived home. From this timestamp, an average speed is measured and a winner of the race can be determined.

Although this method serves its purpose, it has proven somewhat problematic for several reasons. One reason is that the bird's "official time" is not the actual time at which it arrived, but rather the time at which the band was placed in the timer and recorded, which could be many significant seconds later.

Another problem that may arise is that an experienced, high-performing pigeon, which completes the racing course quickly, may then hesitate to enter its home loft, and thereby lose critical seconds, due to a reluctance to undergo the band-removal process if the pigeon finds such process uncomfortable.

The advent of electronic timing systems has made recording the performance of racing pigeons significantly easier than before. As a result of this new way of registering a bird's arrival, several loft management applications have been created and marketed to help racing-pigeon breeders with record keeping, bird pedigree, publication of race results, and maintenance of medical and vaccination history.

It is widely known that with the new electronic timing systems, timing of racing pigeons is much easier than before as the pigeon breeder needs only to rush the pigeons back into the loft, where the event is recorded and registered automatically. Furthermore, if the electronic timing system is connected to the club registration system, all the registered and recorded information is uploaded in real time so that all participants can see the results. However, there still remains a problem of accuracy in the electronic timing system. The accuracy problem comes not from the timing system itself, but from the sensing system used to connect to an electronic tag fixed on the object. Whenever the racing pigeon passes through the sensing system, the sensing system detects the object, records the time and sends all the related information back to the owner as well as the hosting party.

FIG. 1 is an exploded perspective view of an antenna apparatus 100 in accordance with some embodiments of the present disclosure. Referring to FIG. 1, the antenna apparatus 100 has a metal housing 10 configured for implementing the grounding of the antenna apparatus 100 and having a concavity 11 defined therein; a circuit board 20 such as a printed circuit board securely mounted in the concavity 11 of the metal housing 10 via any method known to those skilled in the art, for example, via glue, and having a metal pattern 30 formed on a central portion of the circuit board 20; and a pair of plates 40 such as the brass plates respectively provided on two opposite side portions of the circuit board 20. In some embodiments, the antenna apparatus 100 further comprises a cover 50 having a periphery securely engaged with a periphery of the housing 10 to protect the circuit board 20, the metal pattern 30 and the plates 40 from any potential damage or tampering.

Figure 2:
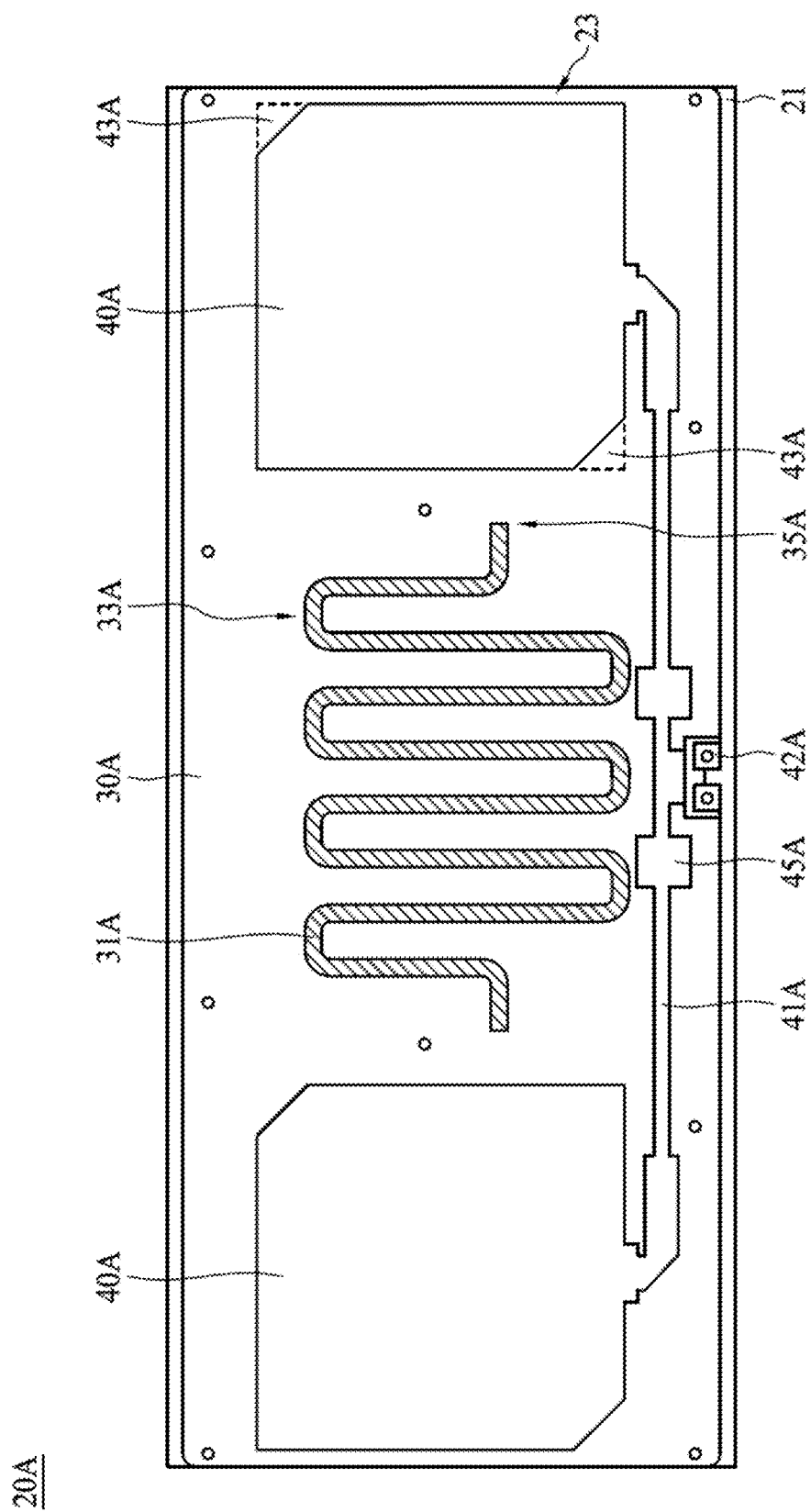
FIG. 2 is schematic plan view of a circuit board with two plates in accordance with one embodiment of the present disclosure.

FIG. 2 is a schematic plan view of a circuit board 20A with two plates 40A in accordance with one embodiment of the present disclosure. As shown in FIG. 2, in some embodiments, the two plates 40A are connected to one another via a metal wire 41A. In some embodiments, a connector 42A, such as a socket device, is provided for receiving external power and sending out information picked up by the antenna apparatus 100. The metal pattern 30A of the circuit board 20A is formed and located at the central portion of the circuit board 20A and wirelessly coupled to each of the two plates 40A. In some embodiments, the metal pattern 30A includes a single wandering metal line 31A with two distal ends 35A each pointing toward a respective one of the two plates 40A. In some embodiments, the single wandering metal line 31A is configured to generate a field effect (FE) coverage at a predetermined frequency, for example, 950 MHz. In some embodiments, the metal line 31A has an even number of turns 33A (e.g., u-turns) on one side and an odd number of turns 33A on the other side, and the generated FE coverage is able to fulfill the balance and wide coverage requirements of the application.

In some embodiments, each of the two plates 40 has at least one truncated corner, such as the two truncated corners 43A shown in FIG. 2, in order to generate a circular FE while coupled with the metal line 31A. In some embodiments, the two truncated corners 43A in each of the two plates 40A are diagonally opposite to one another. In some embodiments, the two plates 40A are substantially square in shape, but the shape of each of the two plates 40A is not limited to be rectangular or square. The plates 40A can be any type of shape, if possible. In some embodiments, in order to increase FE coverage, the metal wire 41A has protrusions 45A integrally formed on the metal wire 41A, the number of the protrusions 45A is even, and the protrusions 45A are arranged symmetrically about the connector 42A.

In some embodiments, the circuit board 20A comprises a substrate 21 such as the FR-4 substrate, and the metal line 31A, the plates 40A, the metal wire 41A and the protrusions 45A are integrally implemented by a metal layer 23 on the substrate 21. In some embodiments, the metal wire 41A is electrically isolated from the metal pattern 30A, e.g., by a dielectric material, such as the FR-4 dielectric or an air gap. In some embodiments, the plates 40A are electrically isolated from the metal pattern 30A, e.g., by a dielectric material, such as the FR-4 dielectric or an air gap.

Figure 3:
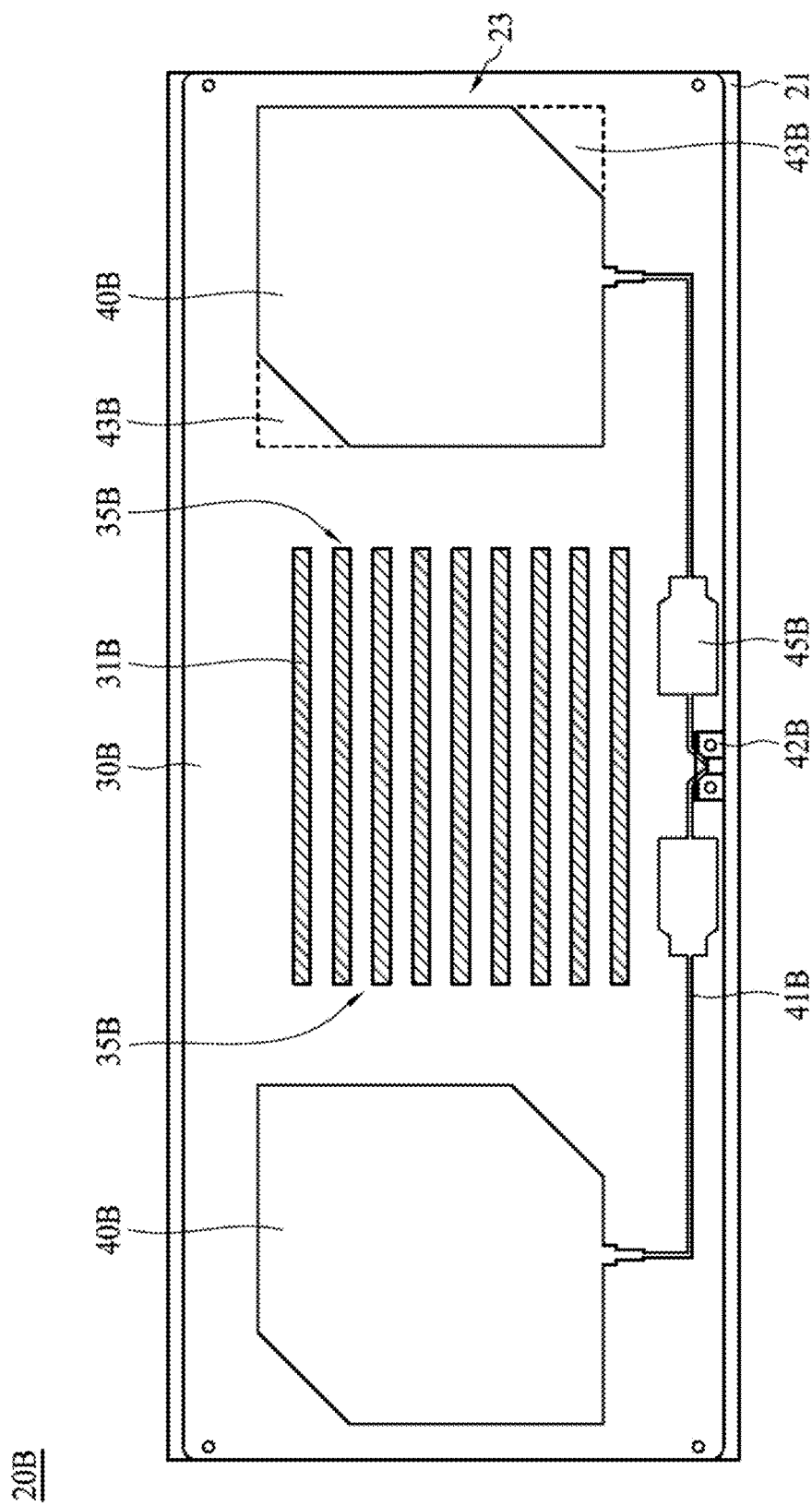
FIG. 3 is schematic plan view of a circuit board with two plates in accordance with another embodiment of the present disclosure.

FIG. 3 is a schematic plan view of a circuit board 20B with two plates 40B in accordance with another embodiment of the present disclosure. Referring to FIG. 3, it should be noted that the two plates 40B are connected to one another via a metal wire 41B. In some embodiments, a connector 42B such as a socket device is provided for receiving external power and sending out information picked up by the antenna apparatus 100. In some embodiments, the metal pattern 30B of the circuit board 20B is formed and located at the central portion of the circuit board 20B and wirelessly coupled to each of the two plates 40B. In some embodiments, the metal pattern 30B includes a plurality of parallel metal lines 31B each with two distal ends 35B each pointing toward a respective one of the two plates 40B. In order to generate a balanced and wide field effect (FE) coverage, the metal lines 31B are arranged very close to one another and the number of the metal lines 31B is as large as possible, e.g. an odd number, such that the FE coverage is able to fulfill the balance and wide coverage requirements.

In some embodiments, each of the two plates 40B has at least one truncated corner, such as the two truncated corners 43B shown in FIG. 3, in order to generate a circular FE while coupled with the metal line 31B. In some embodiments, the two truncated corners 43B in each of the two plates 40B are diagonally opposite to one another. In some embodiments, the two plates 40B are square in shape, but the shape of the plates 40B is not limited to be rectangular or square. In some embodiments, each of the plates 40B can be any type of shape, if possible. In some embodiments, in order to increase FE coverage, the metal wire 41B has protrusions 45B integrally formed on the metal wire 41B, the number of the protrusions 45B is even, and the protrusions 45B are arranged to be symmetric about the connector 42B.

In some embodiments, the circuit board 20B comprises a substrate 21 such as the FR-4 substrate, and the metal line 31B, the plates 40B, the metal wire 41B and the protrusions 45B are integrally implemented by a metal layer 23 on the substrate 21. In some embodiments, the metal wire 41B is electrically isolated from the metal pattern 30B, e.g., by dielectric material, such as the FR-4 dielectric or an air gap. In some embodiments, the plates 40B are electrically isolated from the metal pattern 30B, e.g., by dielectric material, such as the FR-4 dielectric or an air gap.

Figure 4:
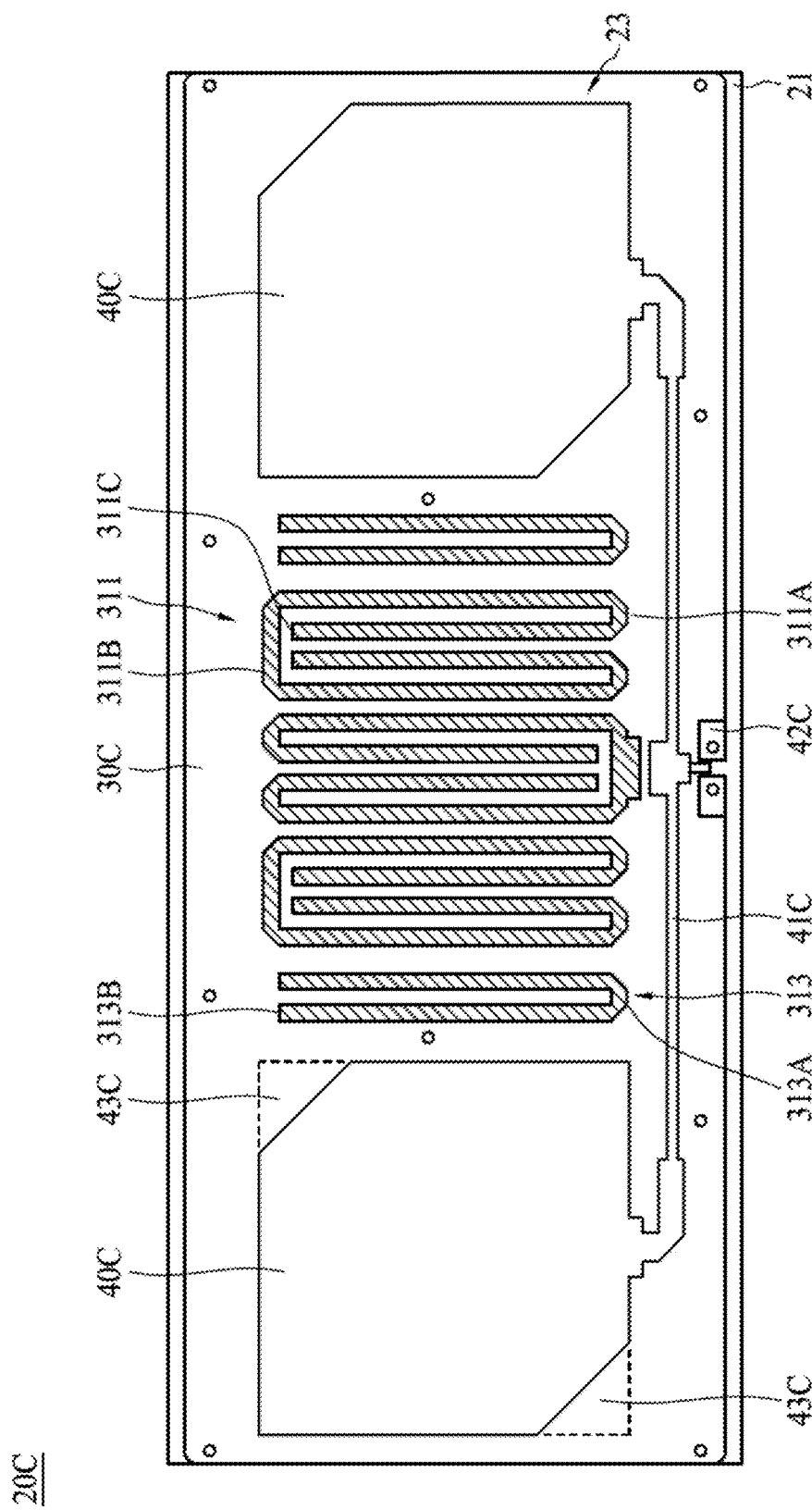
FIG. 4 is schematic plan view of a circuit board with two plates in accordance with another embodiment of the present disclosure.

FIG. 4 is a schematic plan view of a circuit board 20C with two plates 40C in accordance with another embodiment of the present disclosure. Referring to FIG. 4, it should be noted that the two plates 40C are connected to one another via a metal wire 41C. In some embodiments, a connector 42C such as a socket device is provided for receiving external power and sending out information picked up by the antenna apparatus 100. In some embodiments, the metal pattern 30C is formed and located at the central portion of the circuit board 20C and wirelessly coupled to each of the two plates 40C.

In some embodiments, the metal pattern 30C includes a first metal line 311 and a second metal line 313; the first metal line 311 has an even number of turns 311A on one side and an odd number of turns 311B on the other side, and the turn 311B occupies a larger area than the turn 311A. In some embodiments, the first metal line 311 includes two distal ends 311C in the turn 311B. In some embodiments, the second metal lines 313 have an odd number of turns 313A on one side and two distal ends 313B on the other side. In some embodiments, the metal pattern 30C includes an odd number of first metal lines 311 and an even number of second metal lines 313 disposed on two opposite sides of the first metal lines 311, so as to increase FE such that the FE coverage is able to fulfill the balance and wide coverage requirements.

In some embodiments, each of the two plates 40C has at least one truncated corner, such as the two truncated corners 43C as shown, in order to generate a circular FE while coupled with the first metal line 311 and the second metal line 313. In some embodiments, the two truncated corners 43C in each of the two plates 40C are diagonally opposite to one another. In some embodiments, the two plates 40C are square in shape, but the shape of the two plates 40C is not limited to be rectangular or square. In some embodiments, each of the plates 40C can be any type of shape, if possible. In some embodiments, in order to increase FE coverage, the metal wire 41C may have a protrusion 45C integrally formed on the metal wire 41C.

In some embodiments, the circuit board 20C comprises a substrate 21 such as the FR-4 substrate, and the metal line 311, the plates 40C, and the metal wire 41C are integrally implemented by a metal layer 23 on the substrate 21. In some embodiments, the metal wire 41C is electrically isolated from the metal pattern 30C, e.g., by dielectric material, such as the FR-4 dielectric or an air gap. In some embodiments, the plates 40C are electrically isolated from the metal pattern 30C, e.g., by dielectric material, such as the FR-4 dielectric or an air gap.

Figure 5:
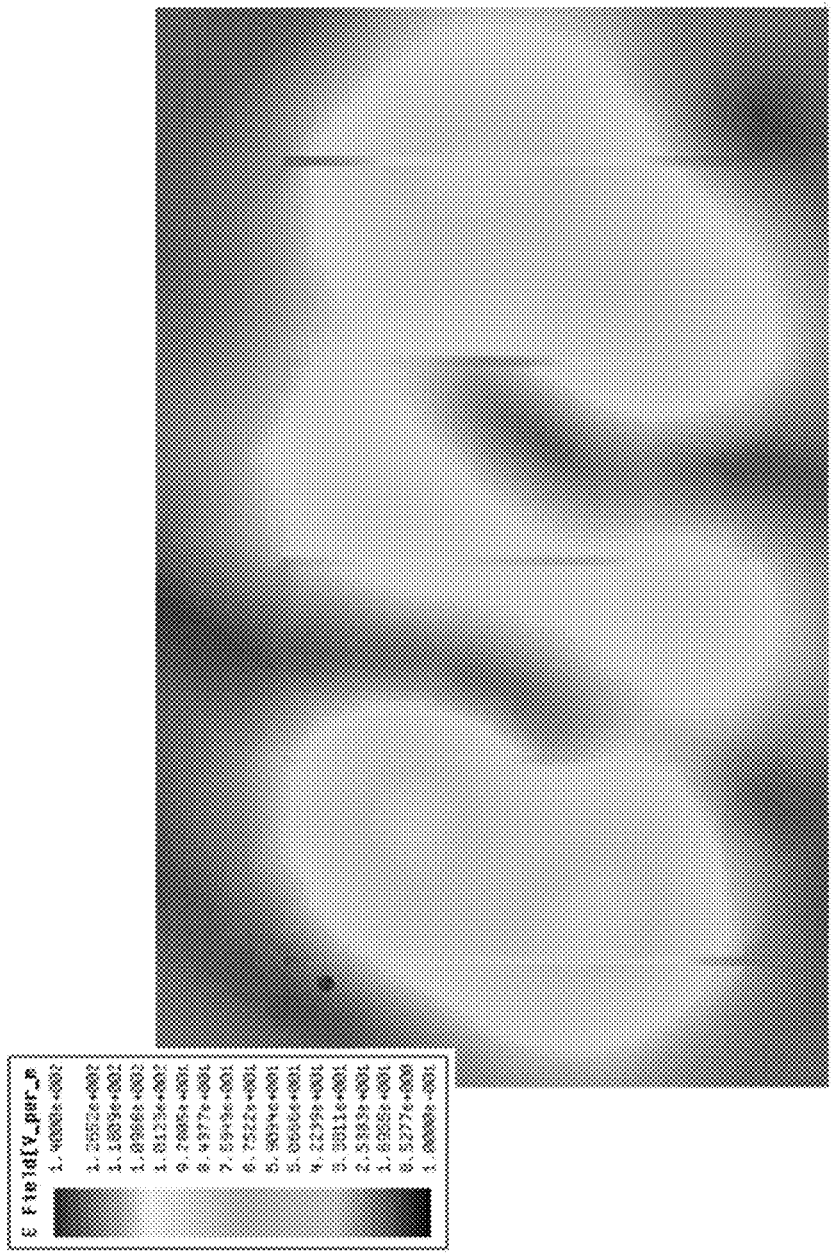
FIG. 5 is a simulated chart showing the field effect of a comparative antenna apparatus having a circuit board without a metal pattern in accordance with a comparative embodiment of the present disclosure.

FIG. 5 is a simulated chart showing the field effect of a comparative antenna apparatus having a circuit board without the metal pattern in accordance with a comparative embodiment of the present disclosure. Referring to FIG. 5, there are still "holes" (dark areas between white zones) in the field, which might cause an inaccurate detection result and then an incorrect timing record when recording an object passing through the field. Such shortcomings exist because the field coverage is insufficient.

Figure 6:
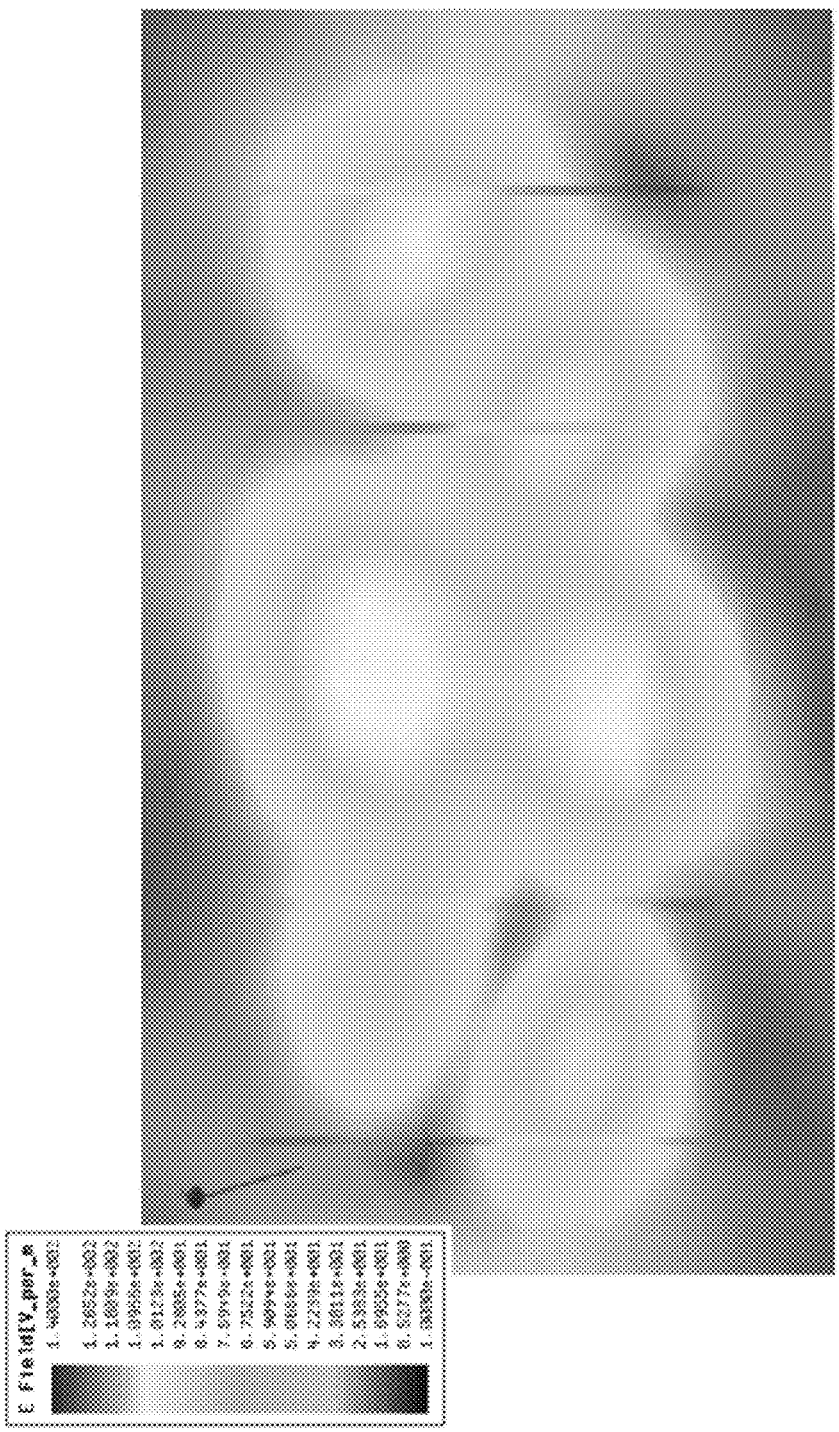
FIG. 6 is a simulated chart showing the field effect of the antenna apparatus having a circuit board with a metal pattern in accordance with some embodiments of the present disclosure.

FIG. 6 is a simulated chart showing the field effect of the antenna apparatus 100 having the circuit board 20 with the metal pattern 30 in accordance with some embodiments of the present disclosure. Referring to FIG. 6, it should be noted that after disposing the metal pattern 30 at the central portion of the circuit board 20 and sandwiched between and coupled to the two plates 40, the field effect is enhanced, and the sensitivity of the antenna apparatus 100 when detecting an object passing through the field (near field detection) is improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An antenna apparatus, the antenna apparatus comprising:
    a metal housing having a concavity defined therein;
    a circuit board disposed inside the concavity of the housing;
    two plates respectively located on opposite side portions of the circuit board; and
    a metal pattern sandwiched between and wirelessly coupled to the two plates.

2. The antenna apparatus of claim 1, wherein the two plates are identically and symmetrically arranged with respect to a central portion of the circuit board.

3. The antenna apparatus of claim 1, wherein each of the two plates is substantially square in shape and has at least one truncated corner.

4. The antenna apparatus of claim 1, wherein each of the two plates has two truncated corners diagonally opposite to one another.

5. The antenna apparatus of claim 1, wherein the metal pattern comprises a single wandering line with two distal ends each pointing toward a respective one of the two plates.

6. The antenna apparatus of claim 1, wherein the metal pattern comprises a plurality of parallel metal lines, and the parallel metal line includes two distal ends each pointing toward a respective one of the two plates.

7. The antenna apparatus of claim 1, wherein the metal pattern comprises a first metal line and two second metal lines disposed at two sides of the first metal line, the first metal line includes a first turn on one side and two second turns on the other side, and the first turn occupies a larger area than the second turn.

8. The antenna apparatus of claim 1, further comprising a metal wire connecting the two plates wherein the metal wire comprises at least one protrusion.

9. The antenna apparatus of claim 8, wherein the metal wire is electrically isolated from the metal pattern.

10. A circuit board, comprising:
   a substrate;
   two plates respectively located on opposite side portions of the substrate;
   a metal pattern sandwiched between and wirelessly coupled to the two plates; and
   a metal wire connecting the two plates.

11. The circuit board of claim 10, wherein each of the two plates is substantially square in shape and has at least one truncated corner.

12. The circuit board of claim 10, wherein each of the two plates has two truncated corners diagonally opposite to one another.

13. The circuit board of claim 10, wherein the metal pattern comprises a single wandering line with two distal ends each pointing toward a respective one of the two plates.

14. The circuit board of claim 10, wherein the metal pattern comprises a plurality of parallel metal lines.

15. The circuit board of claim 10, wherein the metal pattern comprises a first metal line and two second metal lines disposed at two sides of the first metal line.

16. The circuit board of claim 15, wherein the first metal line includes a first turn on one side and two second turns on the other side, and the first turn occupies a larger area than the second turn.

17. The circuit board of claim 16, wherein the first metal line includes two distal ends in the first turn.

18. The circuit board of claim 10, wherein the second metal line includes one turn on one side and two distal ends on the other side.

19. The circuit board of claim 10, further comprising a metal wire connecting the two plates, wherein the metal wire comprises at least one protrusion.

20. The circuit board of claim 19, wherein the metal wire is electrically isolated from the metal pattern.

* * * * *